US012813214B2

(12) United States Patent
Hori

(10) Patent No.: US 12,813,214 B2
(45) Date of Patent: *Nov. 24, 2026

(54) CERAMIC SUBSTRATE, METHOD OF MANUFACTURING THE SAME, ELECTROSTATIC CHUCK, SUBSTRATE FIXING DEVICE, AND SEMICONDUCTOR DEVICE PACKAGE

(71) Applicant: SHINKO ELECTRIC INDUSTRIES CO., LTD., Nagano (JP)

(72) Inventor: Ryosuke Hori, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 165 days.

This patent is subject to a terminal disclaimer.

(21) Appl. No.: 18/732,928

(22) Filed: Jun. 4, 2024

(65) Prior Publication Data

US 2024/0404862 A1 Dec. 5, 2024

(30) Foreign Application Priority Data

Jun. 5, 2023 (JP) ................................ 2023-092635

(51) Int. Cl.
*H10P 72/72* (2026.01)
*C04B 35/10* (2006.01)
(Continued)

(52) U.S. Cl.
CPC ............ *H10P 72/722* (2026.01); *C04B 35/10* (2013.01); *C04B 41/0072* (2013.01); *C04B 41/4539* (2013.01); *C04B 41/4572* (2013.01); *C04B 41/4578* (2013.01); *C04B 41/5133* (2013.01); *C04B 41/88* (2013.01); *C09D 11/037* (2013.01);
(Continued)

(58) Field of Classification Search
CPC ............... H10P 72/722; H10P 72/0431; H10P 72/7612; H10P 95/90; H10P 72/72; C04B 35/10; C04B 41/0072; C04B 41/4539; C04B 41/4572; C04B 41/4578; C04B 41/5133; C04B 41/88; C04B 2235/3222; C04B 2235/764; C04B 2235/3225; C04B 2235/5436; C04B 2235/72; C04B 2235/77; C04B 2235/80; C04B 2237/343; C04B 2237/62; C04B 35/117; C04B 35/44; C04B 41/009; C09D 11/037; C09D 11/52; H01J 37/32715; H01J 2237/2007; H01J 2237/334; B32B 18/00
See application file for complete search history.

(56) References Cited

U.S. PATENT DOCUMENTS

2020/0075383 A1 3/2020 Minemura
2021/0330425 A1* 10/2021 Yang ........................ A61C 1/12

FOREIGN PATENT DOCUMENTS

JP 2020-043336 A 3/2020

* cited by examiner

*Primary Examiner* — Daniel Cavallari
(74) *Attorney, Agent, or Firm* — Rankin, Hill & Clark LLP

(57) ABSTRACT

A ceramic substrate includes a base, and a conductor pattern incorporated in the base. The base is a ceramic, and the conductor pattern includes, as a main component, a solid solution of a body-centered cubic lattice structure in which nickel and manganese are solid solved in tungsten, a solid solution of a body-centered cubic lattice structure in which nickel and niobium are solid solved in tungsten, or a solid solution of a body-centered cubic lattice structure in which nickel and indium are solid solved in tungsten.

9 Claims, 10 Drawing Sheets

CROSS-SECTIONAL VIEW ILLUSTRATING SIMPLIFIED EXAMPLE OF SUBSTRATE FIXING DEVICE ACCORDING TO FIRST EMBODIMENT

(51) Int. Cl.
*C04B 41/00* (2006.01)
*C04B 41/45* (2006.01)
*C04B 41/51* (2006.01)
*C04B 41/88* (2006.01)
*C09D 11/037* (2014.01)
*C09D 11/52* (2014.01)
*H01J 37/32* (2006.01)

(52) U.S. Cl.
CPC ........ *C09D 11/52* (2013.01); *H01J 37/32715* (2013.01); *C04B 2235/3222* (2013.01); *C04B 2235/764* (2013.01); *H01J 2237/2007* (2013.01); *H01J 2237/334* (2013.01)

CROSS-SECTIONAL VIEW ILLUSTRATING SIMPLIFIED EXAMPLE OF SUBSTRATE FIXING DEVICE ACCORDING TO FIRST EMBODIMENT

PLAN VIEW ILLUSTRATING SIMPLIFIED EXAMPLE OF SUBSTRATE FIXING DEVICE ACCORDING TO FIRST EMBODIMENT

PERSPECTIVE VIEW (PART 1) ILLUSTRATING MANUFACTURING PROCESS
OF ELECTROSTATIC CHUCK ACCORDING TO FIRST EMBODIMENT

PERSPECTIVE VIEW (PART 2) ILLUSTRATING MANUFACTURING PROCESS OF ELECTROSTATIC CHUCK ACCORDING TO FIRST EMBODIMENT

FIG. 8

EXAMINATION RESULT OF LIQUID PHASE FORMATION TEMPERATURE IN EXAMPLE 4

| | ~ | Si | Co | B | Mg | Ca | Sc | Ti | V | Cr | Mn | Fe | Zn | Ga | Ge | Sr | Zr | Nb | Mo | In | Sn | Sb | Ba |
|---|---|---|---|---|---|---|---|---|---|---|---|---|---|---|---|---|---|---|---|---|---|---|---|
| ~ | 1500 | 1440 | 1360 | | | | | | | | 1440 | | | | | | | 1450 | | 1430 | 1260 | | |
| B | | | | | | | | | | 1460 | 1410 | | | | | | | 1430 | | | 1080 | | |
| Mg | | | | | | | | | | | 1420 | 1450 | | | | | | 1450 | | 1430 | 1270 | 1110 | |
| Ca | | | | | | | | | | | | | | | | | | 1450 | | 1430 | 1270 | 1110 | |
| Sc | | | | | | | | | | | 1440 | | | | | | | 1450 | | 1430 | 1270 | 1110 | |
| Ti | | | | | | | | | | | | | | | | | | 1450 | | 1430 | 1250 | 1150 | |
| V | | | | | | | | | | | 1440 | 1450 | | | | | | 1450 | | 1430 | 1260 | 1150 | |
| Cr | | | | | | | | | | | 1450 | 1450 | | | | | | 1440 | | 1430 | 1260 | 1110 | |
| Mn | | | | | | | | | | | | 1420 | 1440 | 1430 | 1440 | 1440 | 1440 | 1410 | 1440 | 1370 | 1240 | 1110 | 1430 |
| Fe | | | | | | | | | | | | | | 1430 | 1450 | | | 1420 | 1450 | | 1320 | 910 | |
| Zn | | | | | | | | | | | | | | | | | | 1450 | | 1430 | 1260 | 1110 | |
| Ga | | | | | | | | | | | | | | | | | | 1450 | | 1410 | 1250 | 1100 | |
| Ge | | | | | | | | | | | | | | | | | | 1450 | | 1420 | 1260 | 1110 | |
| Sr | | | | | | | | | | | | | | | | | | 1440 | | 1430 | 1260 | 1110 | |
| Zr | | | | | | | | | | | | | | | | | | 1450 | | 1430 | 1260 | 1110 | |
| Nb | | | | | | | | | | | | | | | | | | | 1460 | 1390 | 1260 | 1110 | 1450 |
| Mo | | | | | | | | | | | | | | | | | | | | 1430 | 1260 | 1110 | |
| In | | | | | | | | | | | | | | | | | | | | | 1160 | 1070 | 1430 |
| Sn | | | | | | | | | | | | | | | | | | | | | | 960 | 1260 |
| Sb | | | | | | | | | | | | | | | | | | | | | | | 1110 |
| Ba | | | | | | | | | | | | | | | | | | | | | | | |

CROSS-SECTIONAL VIEW ILLUSTRATING EXAMPLE OF SEMICONDUCTOR DEVICE PACKAGE ACCORDING TO SECOND EMBODIMENT

PLAN VIEW ILLUSTRATING EXAMPLE OF SEMICONDUCTOR DEVICE PACKAGE ACCORDING TO SECOND EMBODIMENT

CERAMIC SUBSTRATE, METHOD OF MANUFACTURING THE SAME, ELECTROSTATIC CHUCK, SUBSTRATE FIXING DEVICE, AND SEMICONDUCTOR DEVICE PACKAGE

CROSS-REFERENCE TO RELATED APPLICATIONS

This application claims priority from Japanese Patent Application No. 2023-092635, filed on Jun. 5, 2023, the entire content of which is incorporated herein by reference.

TECHNICAL FIELD

The present invention relates to a ceramic substrate, a method of manufacturing the same, an electrostatic chuck, a substrate fixing device, and a semiconductor device package.

BACKGROUND ART

In the related art, a film forming apparatus or a plasma etching apparatus used for manufacturing a semiconductor device includes a stage for accurately holding a wafer in a vacuum processing chamber. As the stage, for example, a substrate fixing device that suctions and holds a wafer by an electrostatic chuck mounted on a base plate has been proposed.

The electrostatic chuck is formed of a ceramic substrate having a base, an electrostatic electrode incorporated in the base, or the like. The electrostatic electrode is, for example, a sintered body containing tungsten as a main component, nickel oxide, aluminum oxide, and silicon dioxide.

In the above sintered body, a ceramic and tungsten are sintered under the same conditions, but since tungsten has a high melting point (3300° C. or higher), it is difficult to sinter the sintered body, and it is necessary to add an appropriate sintering aid. In the above sintered body, nickel oxide, aluminum oxide, and silicon dioxide function as the sintering aid (for example, see JP2020-043336A).

SUMMARY OF INVENTION

Some materials that function as the sintering aid for sintering tungsten are relatively difficult to obtain. Therefore, the number of selections of the materials functioning as the sintering aid is preferably large, and a new sintering aid for sintering tungsten is required.

The present invention has been made in view of the above points, and an object thereof is to provide a ceramic substrate in which a conductor pattern containing tungsten is sintered using a sintering aid different from one in the related art.

According to an aspect of the present disclosure, there is provided a ceramic substrate includes a base, and a conductor pattern incorporated in the base. The base is a ceramic, and the conductor pattern includes, as a main component, a solid solution of a body-centered cubic lattice structure in which nickel and manganese are solid solved in tungsten, a solid solution of a body-centered cubic lattice structure in which nickel and niobium are solid solved in tungsten, or a solid solution of a body-centered cubic lattice structure in which nickel and indium are solid solved in tungsten.

According to the disclosed technique, it is possible to provide the ceramic substrate in which the conductor pattern containing tungsten is sintered using a sintering aid different from one in the related art.

BRIEF DESCRIPTION OF DRAWINGS

FIG. 8 is a graph showing examination results of a liquid phase formation temperature in Example 4.

DESCRIPTION OF EMBODIMENTS

Figure 1:
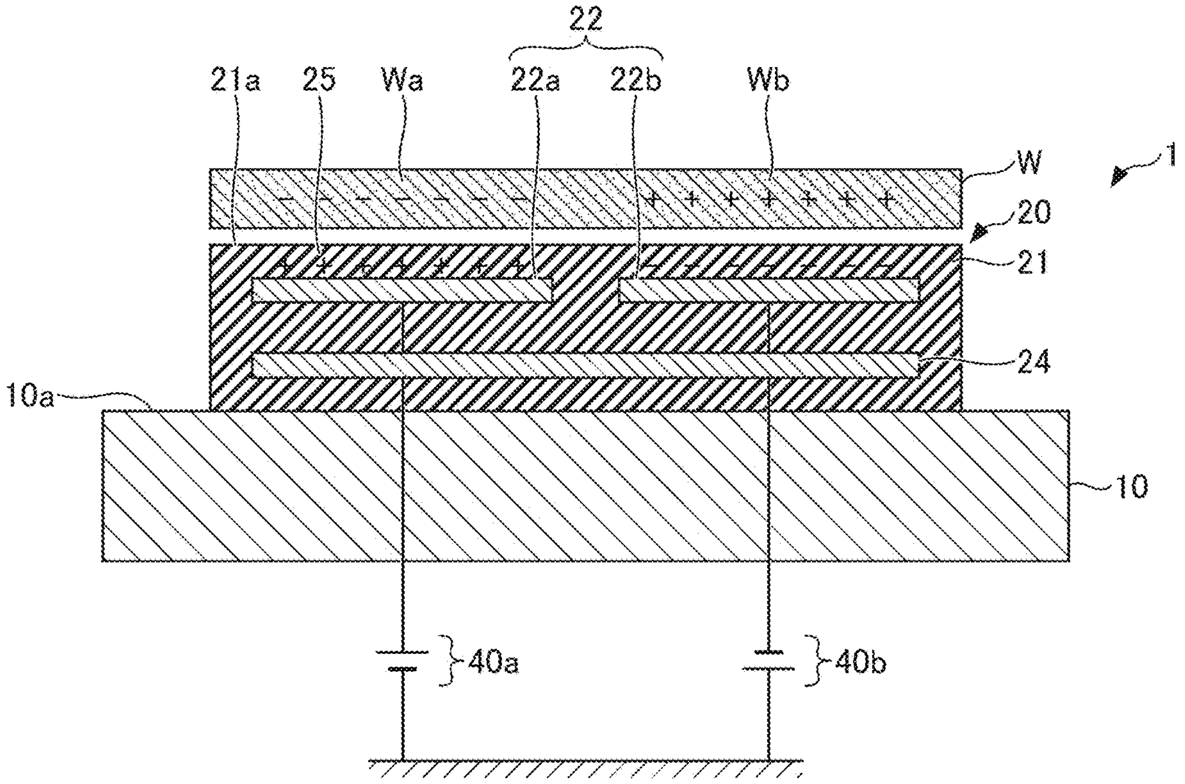
FIG. 1 is a cross-sectional view illustrating a simplified example of a substrate fixing device according to a first embodiment.

Hereinafter, embodiments of the present invention will be described with reference to the drawings. In the drawings, the same components are denoted by the same reference numerals, and redundant description thereof may be omitted.

First Embodiment

[Structure of Substrate Fixing Device]

FIG. 1 is a cross-sectional view simplifying and illustrating a substrate fixing device according to a first embodiment. Referring to FIG. 1, a substrate fixing device 1 includes a base plate 10 and an electrostatic chuck 20 as main components. The substrate fixing device 1 is a device that suctions and holds a substrate W (for example, a semiconductor wafer or the like), which is a suction target object, by the electrostatic chuck 20.

The base plate 10 is a member for mounting the electrostatic chuck 20. The thickness of the base plate 10 is, for example, about 20 to 40 mm. The base plate 10 is formed of, for example, a metal material such as aluminum or a super hard alloy, a composite material of the metal material and a ceramic material, or the like, and can be used as an electrode or the like for controlling plasma. For example, in terms of availability, ease of processing, good thermal conductivity, or the like, it is preferable to use aluminum or an alloy thereof and to perform an alumite treatment (insulating layer formation) on a surface thereof.

For example, by supplying a predetermined high frequency power to the base plate 10, it is possible to control energy for causing generated ions or the like in a plasma state to collide with the substrate W suctioned on the electrostatic chuck 20, and to effectively perform etching processing.

A gas supply passage for introducing an inert gas for cooling the substrate W suctioned on the electrostatic chuck 20 may be provided inside the base plate 10. When an inert gas such as He or Ar is introduced into the gas supply passage from the outside of the substrate fixing device 1 and the inert gas is supplied to a back surface of the substrate W suctioned on the electrostatic chuck 20, the substrate W can be cooled.

A coolant flow path may be provided inside the base plate 10. The coolant flow path is, for example, an annular hole formed inside the base plate 10. A coolant such as cooling water or Galden is introduced into the coolant flow path from the outside of the substrate fixing device 1. By circulating the coolant through the coolant flow path to cool the base plate 10, the substrate W suctioned on the electrostatic chuck 20 can be cooled.

The electrostatic chuck 20 is a portion that suctions and holds the substrate W which is a suction target object. A planar shape of the electrostatic chuck 20 is formed according to a shape of the substrate W, and is, for example, circular. A diameter of the wafer which is the suction target object by the electrostatic chuck 20 is, for example, 8, 12, or 18 inches.

The "planar view" refers to a view of an object from a direction normal to an upper surface 10*a* of the base plate 10, and the "planar shape" refers to a shape of the object viewed from the direction normal to the upper surface 10*a* of the base plate 10.

The electrostatic chuck 20 is provided on the upper surface 10*a* of the base plate 10 via an adhesive layer. The adhesive layer is, for example, a silicone-based adhesive. A thickness of the adhesive layer is, for example, about 0.1 to 2.0 mm. The adhesive layer adheres to the base plate 10 and the electrostatic chuck 20, and has an effect of reducing stress caused by a difference in thermal expansion coefficient between the electrostatic chuck 20 made of a ceramic and the base plate 10 made of aluminum. The electrostatic chuck 20 may be fixed to the base plate 10 by screws.

The electrostatic chuck 20 is a ceramic substrate having a base body 21, an electrostatic electrode 22, and a heating element 24 as main components. An upper surface of the base 21 is a placement surface 21*a* on which the suction target object is placed. The electrostatic chuck 20 is, for example, a Johnsen-Rahbek type electrostatic chuck. However, the electrostatic chuck 20 may be a Coulomb force type electrostatic chuck.

The base 21 is a dielectric. The thickness of the base 21 is, for example, about 5 to 10 mm, and a relative dielectric constant (1 kHz) of the base 21 is, for example, about 9 to 10. The base 21 preferably has an insulation resistivity of $10^{14}$ Ωcm or more at 300° C.

The base 21 is, for example, a ceramic containing aluminum oxide ($Al_2O_3$) or yttrium aluminum garnet (YAG) as a main component.

The base 21 is preferably an aluminum oxide ceramic containing an yttrium aluminum garnet phase (YAG phase) by 10 mol % or more and 80 mol % or less. Accordingly, the insulation resistivity of the base 21 at 300° C. can be $10^{14}$ Ωcm or more at 300° C.

The base 21 may be an aluminum oxide ceramic having a purity of aluminum oxide of 99 wt % or more. Accordingly, the insulation resistivity of the base 21 at 300° C. can be $10^{14}$ Ωcm or more at 300° C. The purity of 99% or more indicates that the base 21 is formed without adding a sintering aid. In addition, the purity of 99% or more means that unintended impurities may be contained in a manufacturing process or the like. The base 21 preferably has a relative density of 97% or more with respect to aluminum oxide. In the base 21, an average particle diameter of aluminum oxide is preferably 1.0 μm or less in order to improve sinterability.

The electrostatic electrode 22 is a thin-film electrode formed of a conductor pattern, and is incorporated in the base 21. In the present embodiment, the electrostatic electrode 22 is of a bipolar type and includes a first electrostatic electrode 22*a* and a second electrostatic electrode 22*b*. As the electrostatic electrode 22, a unipolar type including one electrostatic electrode may be used.

A main component of the electrostatic electrode 22 is, for example, a solid solution having a body-centered cubic lattice structure in which nickel and manganese are solid solved in tungsten. A main component of the electrostatic electrode 22 may be a solid solution having a body-centered cubic lattice structure in which nickel and niobium are solid solved in tungsten. The main component of the electrostatic electrode 22 may be a solid solution having a body-centered cubic lattice structure in which nickel and indium are solid solved in tungsten.

The main component of the electrostatic electrode 22 may be a solid solution having a body-centered cubic lattice structure in which nickel, manganese, and a predetermined element are solid solved in tungsten. The predetermined element in this case is boron, magnesium, scandium, vanadium, chromium, iron, zinc, gallium, germanium, strontium, zirconium, niobium, molybdenum, or barium.

The main component of the electrostatic electrode 22 may be a solid solution having a body-centered cubic lattice structure in which nickel, niobium, and a predetermined element are solid solved in tungsten. The predetermined element in this case is boron, magnesium, calcium, scandium, titanium, vanadium, chromium, manganese, iron, zinc, gallium, germanium, strontium, zirconium, molybdenum, indium, or barium.

The main component of the electrostatic electrode 22 may be a solid solution having a body-centered cubic lattice structure in which nickel, indium, and a predetermined element are solid solved in tungsten. The predetermined element in this case is magnesium, calcium, scandium, titanium, vanadium, chromium, zinc, gallium, germanium, strontium, zirconium, niobium, molybdenum, or barium.

Here, the main component means a component occupying 50 wt % or more of all substances constituting the electrostatic electrode 22. In the electrostatic electrode 22, the ratio of nickel and manganese to tungsten is preferably 0.05 wt % or more and 10 wt % or less. The same applies to the cases of nickel and niobium, or nickel and indium, and the ratio of each to tungsten is preferably 0.05 wt % or more and 10 wt % or less. The ratio of the predetermined element described above to tungsten is preferably 0.05 wt % or more and 10 wt % or less.

The first electrostatic electrode 22*a* is connected to a positive electrode side of a power supply 40*a* provided outside the substrate fixing device 1. The second electrostatic electrode 22*b* is connected to a negative electrode side of a power supply 40*b* provided outside the substrate fixing device 1. The negative electrode side of the power supply 40*a* and the positive electrode side of the power supply 40*b* are connected outside the substrate fixing device 1, and a connection point is a ground potential.

A positive (+) voltage is applied from the power supply 40*a* to the first electrostatic electrode 22*a*, and a negative (−)

voltage is applied from the power supply 40*b* to the second electrostatic electrode 22*b*. Accordingly, the first electrostatic electrode 22*a* is charged with the positive (+) charge, and the second electrostatic electrode 22*b* is charged with the negative (−) charge. Accordingly, the negative (−) charge is induced in a portion Wa of the substrate W corresponding to the first electrostatic electrode 22*a*, and the positive (+) charge is induced in a portion Wb of the substrate W corresponding to the second electrostatic electrode 22*b*.

When the substrate W, the electrostatic electrode 22, and a ceramic portion 25 of the electrostatic chuck 20 (base 21) disposed therebetween are regarded as capacitors, the ceramic portion 25 corresponds to a dielectric layer. Then, the substrate W is electrostatically sucked onto the electrostatic chuck 20 by Coulomb force generated between the electrostatic electrode 22 and the substrate W via the ceramic portion 25. A suction-holding force increases as the voltage applied to the electrostatic electrode 22 increases.

The heating element 24 is a heater that is incorporated in the base 21 and generates heat when a current flows to heat the placement surface 21*a* of the base 21 to a predetermined temperature. The heating element 24 is disposed below (at a base plate 10 side of) the first electrostatic electrode 22*a* and the second electrostatic electrode 22*b*. The heating element 24 is a conductor formed in a film shape. The heating element 24 is provided as a plurality of heater electrodes capable of independently controlling heating of a plurality of regions (heater zones) of the base 21 in a plane. The heating element 24 may be provided as one heater electrode. The heating element 24 can be formed of, for example, a material similar to that of the electrostatic electrode 22.

When a current is supplied to the heating element 24 from a power supply provided outside the substrate fixing device 1, the heating element 24 generates heat to heat the electrostatic chuck 20. The substrate W is controlled to a predetermined temperature by the temperature of the electrostatic chuck 20. A heating temperature of the electrostatic chuck 20 is set within a range of 50° C. to 200° C., for example, 150° C.

Figure 2:
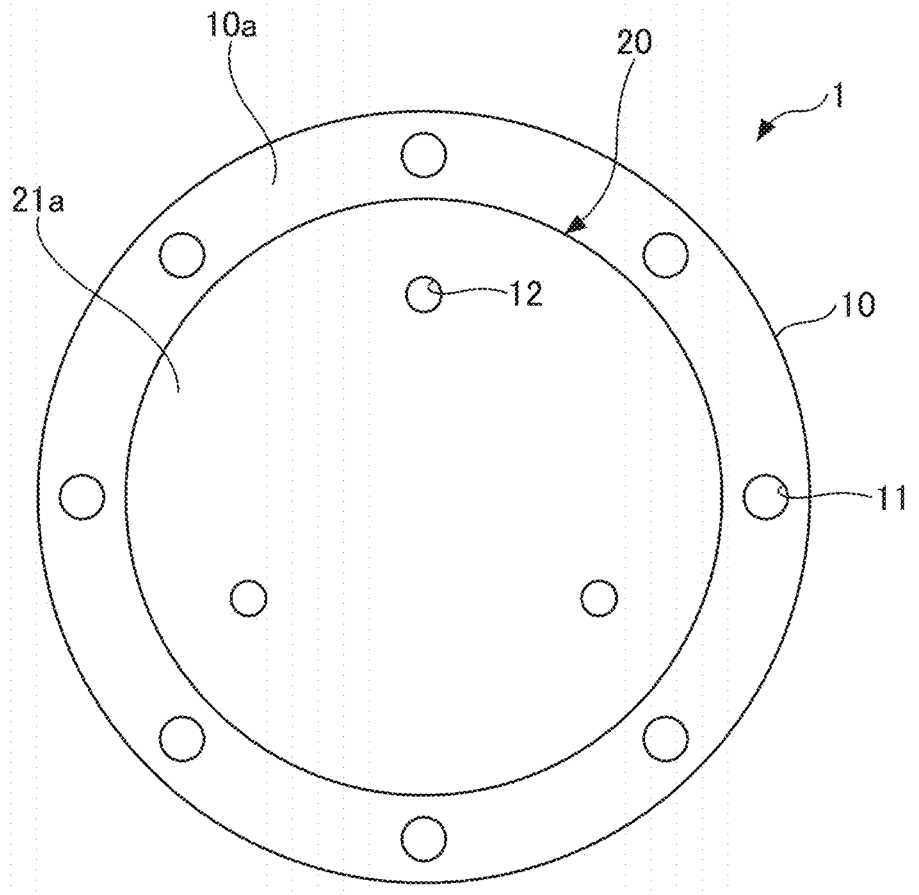
FIG. 2 is a plan view illustrating the simplified example of the substrate fixing device according to the first embodiment.

FIG. 2 is a plan view schematically illustrating the substrate fixing device according to the first embodiment. Referring to FIG. 2, in the substrate fixing device 1, the electrostatic chuck 20 is disposed on the disk-shaped base plate 10, and a peripheral portion of the base plate 10 is exposed at a periphery of the electrostatic chuck 20. In the peripheral portion of the base plate 10, attachment holes 11 for attaching the base plate 10 to a chamber of a semiconductor manufacturing device are arranged along the peripheral portion.

Further, the electrostatic chuck 20 and the base plate 10 have a plurality of (three in FIG. 2) lift pin openings 12 in a central portion thereof. A lift pin that moves the substrate W in an upper-lower direction is inserted into the lift pin opening 12. By raising the substrate W from the placement surface 21*a* by the lift pins, the substrate W can be automatically transferred by a transfer device.

[Method of Manufacturing Electrostatic Chuck]

Next, a method of manufacturing the electrostatic chuck 20 will be described. FIGS. 3A to 4C are perspective views illustrating the manufacturing process of the electrostatic chuck according to the first embodiment.

Figure 3A:
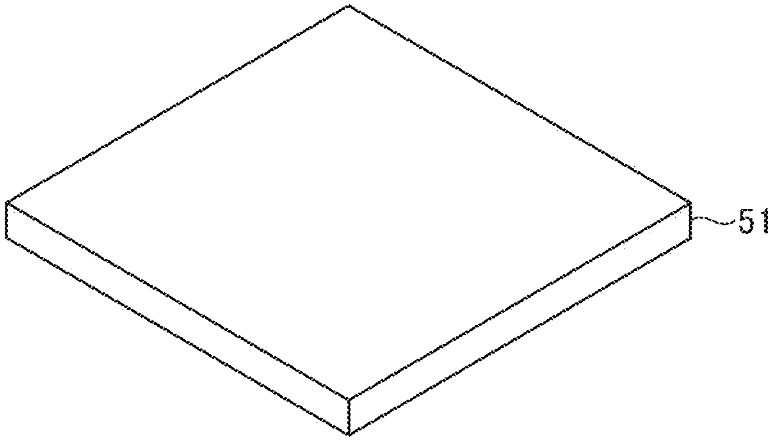
FIGS. 3A to 3C are perspective views (part 1) illustrating a manufacturing process of an electrostatic chuck according to the first embodiment.

First, as shown in FIG. 3A, a green sheet 51 made of a ceramic material and an organic material is prepared. The green sheet 51 is formed in a rectangular plate shape, for example. The ceramic material of the green sheet 51 is aluminum oxide and does not contain the sintering aid. The green sheet 51 becomes the base body 21 of a portion on which the substrate W shown in FIG. 1 is mounted when the organic component is removed and the ceramic material is sintered and densified.

Figure 3B:
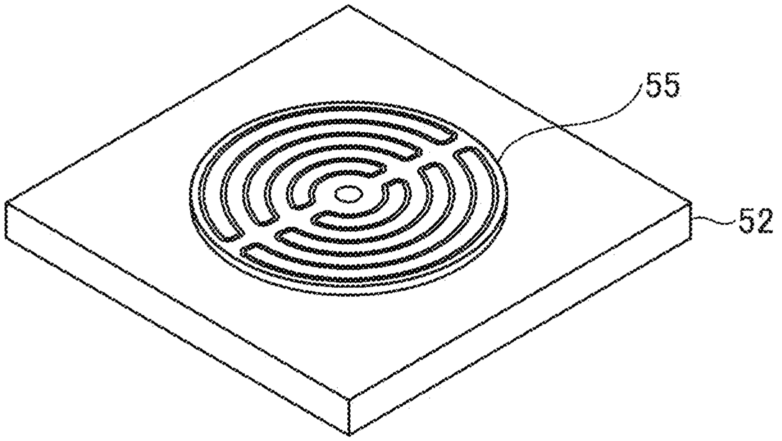

Next, as shown in FIG. 3B, a green sheet 52 made of a material and having a shape similar to those of the green sheet 51 is prepared, and a conductive paste is printed on an upper surface of the green sheet 52 by, for example, a printing method (screen printing) to form a conductor pattern 55. The conductor pattern 55 becomes the electrostatic electrode 22 shown in FIG. 1 by being fired in a step to be described later. The conductor pattern 55 may be formed on a lower surface of the green sheet 51.

For forming the conductor pattern 55, a conductive paste obtained by adding nickel oxide and manganese oxide to tungsten, a conductive paste obtained by adding nickel oxide and niobium oxide to tungsten, or a conductive paste obtained by adding nickel oxide and indium oxide to tungsten is used. The conductive paste used for forming the conductor pattern 55 may further contain the predetermined element described above. The conductive paste used for forming the conductor pattern 55 may further contain an organic material or the like.

An addition amount of nickel oxide and manganese oxide is, for example, preferably 0.1 g or more and 10 g or less with respect to 100 g of tungsten. That is, in the conductive paste, the ratio of nickel oxide and manganese oxide to tungsten is preferably 0.1 wt % or more and 10 wt % or less. When the ratio of nickel oxide and manganese oxide to tungsten is 0.1 wt % or more, a liquid phase formation temperature of the conductive paste can be 1450° C. or less. The similarity applies to nickel oxide and niobium oxide, and nickel oxide and indium oxide, and the ratio of each to tungsten is preferably 0.1 wt % or more and 10 wt % or less.

Even if the ratio of nickel oxide and manganese oxide, nickel oxide and niobium oxide, or nickel oxide and indium oxide to tungsten is more than 10 wt %, the liquid phase formation temperature of the conductive paste is still 1450° C. or less. However, when the ratio of nickel oxide and manganese oxide, nickel oxide and niobium oxide, or nickel oxide and indium oxide to tungsten is more than 10 wt %, electrical characteristics of tungsten are less likely to be exhibited in a solid solution containing tungsten produced by sintering the conductive paste. Therefore, the ratio of nickel oxide and manganese oxide, nickel oxide and niobium oxide, or nickel oxide and indium oxide to tungsten is preferably 10 wt % or less. When the conductive paste and the green sheet are fired simultaneously, an average particle size of tungsten is preferably 0.5 μm or more and 3.0 μm or less.

Figure 3C:
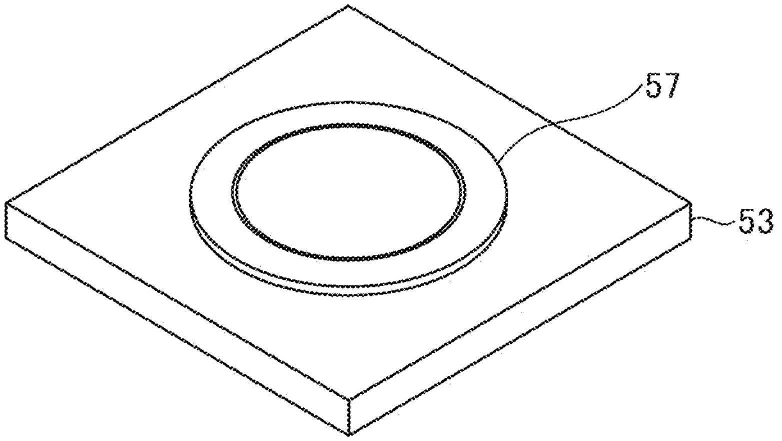

Next, as shown in FIG. 3C, a green sheet 53 made of a material and having a shape similar to those of the green sheet 51 is prepared, and a conductive paste is printed on an upper surface of the green sheet 53 by, for example, a printing method (screen printing) to form a conductor pattern 57. As the conductive paste forming the conductor pattern 57, a conductive paste of the same material as the conductive paste forming the conductor pattern 55 described above can be used. The green sheet 53 is used to form the heating element 24 shown in FIG. 1 by being fired, and serves as the base body 21 at a portion adhered to the base plate 10. The conductor pattern 57 becomes the heating element 24 by being fired in a step to be described later. The conductor pattern 57 may be formed on a lower surface of the green sheet 52.

Figure 4A:
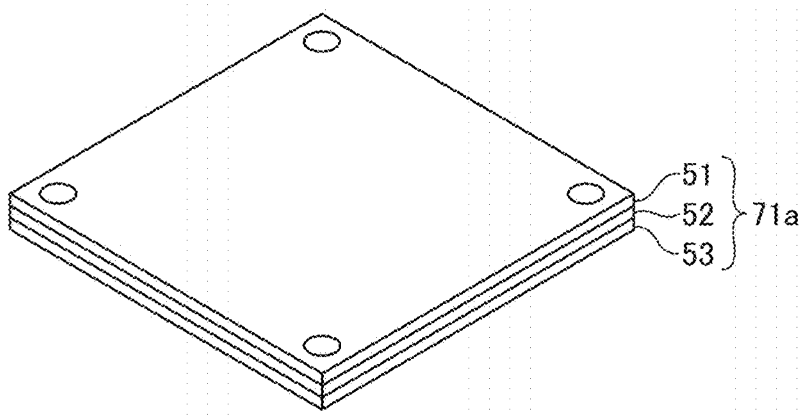
FIGS. 4A to 4C are perspective views (part 2) illustrating the manufacturing process of the electrostatic chuck according to the first embodiment.

Next, as shown in FIG. 4A, the green sheets 51 to 53 are stacked to form a structure 71*a*. The green sheets 51 to 53 are bonded to each other by being pressurized while being heated. Next, as shown in FIG. 4B, a periphery of the structure 71*a* is cut to form a disk-shaped structure 71*b*.

Figure 4B:
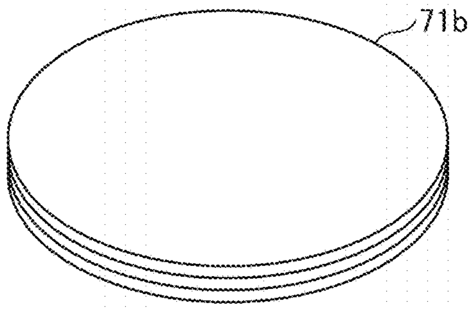
Figure 4C:
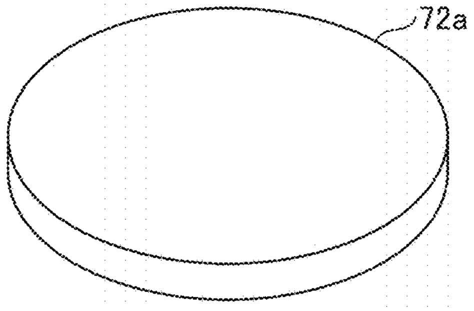

Next, the structure 71*b* shown in FIG. 4B is fired to obtain a ceramic substrate 72*a* shown in FIG. 4C. The temperature for firing the structure 71*b* is, for example, 1600° C. In this step, the electrostatic electrode 22 is obtained by sintering the conductor pattern 55, and the heating element 24 is obtained by sintering the conductor pattern 57. Since the liquid phase formation temperature of the conductive paste in which nickel oxide and manganese oxide, nickel oxide and niobium oxide, or nickel oxide and indium oxide are added to tungsten is 1450° C. or lower, the conductive paste is easily sintered at a temperature (for example, 1600° C.) at which the ceramic substrate 72*a* is fired. Accordingly, the electrostatic electrode 22 and the heating element 24 are formed which contain, as a main component, a solid solution of a body-centered cubic lattice structure in which nickel and manganese, nickel and niobium, or nickel and indium are solid solved in tungsten.

It should be noted that tungsten is sintered in a temperature range from the liquid phase formation temperature of the conductive paste to the temperature (for example, 1600° C.) at which the ceramic substrate 72*a* is fired, and if this temperature range is narrow, tungsten cannot be sufficiently sintered. The liquid phase formation temperature is preferably 1450° C. or lower. When the liquid phase formation temperature is 1450° C. or lower, tungsten can be sufficiently sintered.

On the other hand, the liquid phase formation temperature of the conductive paste should not be too low. When the temperature range from the liquid phase formation temperature to the temperature (for example, 1600° C.) at the time of firing the ceramic substrate 72*a* is widened, the probability that tungsten is burned too much to cause excessive sintering increases. When tungsten is excessively sintered, adhesion to the ceramic is reduced. The liquid phase formation temperature is preferably 1390° C. or higher. When the liquid phase formation temperature is 1390° C. or higher, the probability of excessive sintering of tungsten can be reduced.

Next, various processes are performed on the ceramic substrate 72*a* to complete the electrostatic chuck 20. For example, upper and lower surfaces of the ceramic substrate 72*a* are polished to form the placement surface and an adhering surface. The lift pin openings 12 shown in FIG. 2 are formed in the ceramic substrate 72*a*.

Hereinafter, the present invention will be described more specifically with reference to examples, but the present invention is not limited to these examples.

[Examination of Liquid Phase Formation Temperature]

In Example 1, 1 g of nickel oxide and 1 g of manganese oxide were added to 100 g of tungsten, and a liquid phase formation temperature in a case where an adjustment was performed in an atmosphere of nitrogen and hydrogen was calculated by Fact Sage (manufactured by Research Center of Computational Mechanics, Inc). Fact Sage is software for quantitatively predicting a thermodynamic equilibrium state of a multi-component system.

Figure 5:
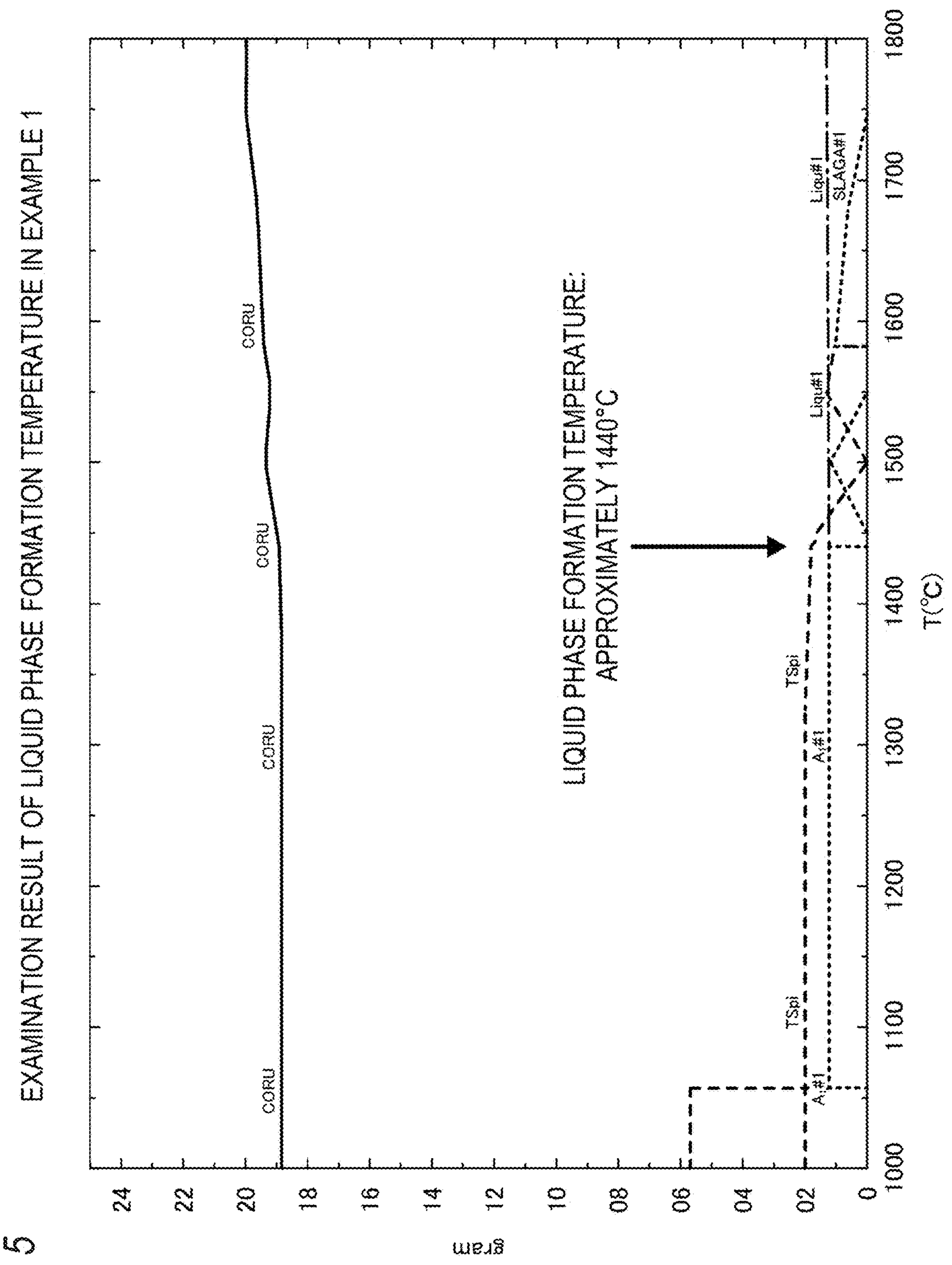
FIG. 5 is a graph showing examination results of a liquid phase formation temperature in Example 1.

Calculation results of Example 1 are shown in FIG. 5. As shown in FIG. 5, it was confirmed by calculation that a solid solution having a body-centered cubic lattice structure in which nickel and manganese were solid solved in tungsten was formed by sintering the materials according to Example 1. Further, in Example 1, the liquid phase formation temperature was about 1440° C.

Next, in Example 2, 1 g of nickel oxide and 1 g of niobium oxide were added to 100 g of tungsten, and a liquid phase formation temperature in a case where an adjustment was performed in an atmosphere of nitrogen and hydrogen was calculated by Fact Sage.

Figure 6:
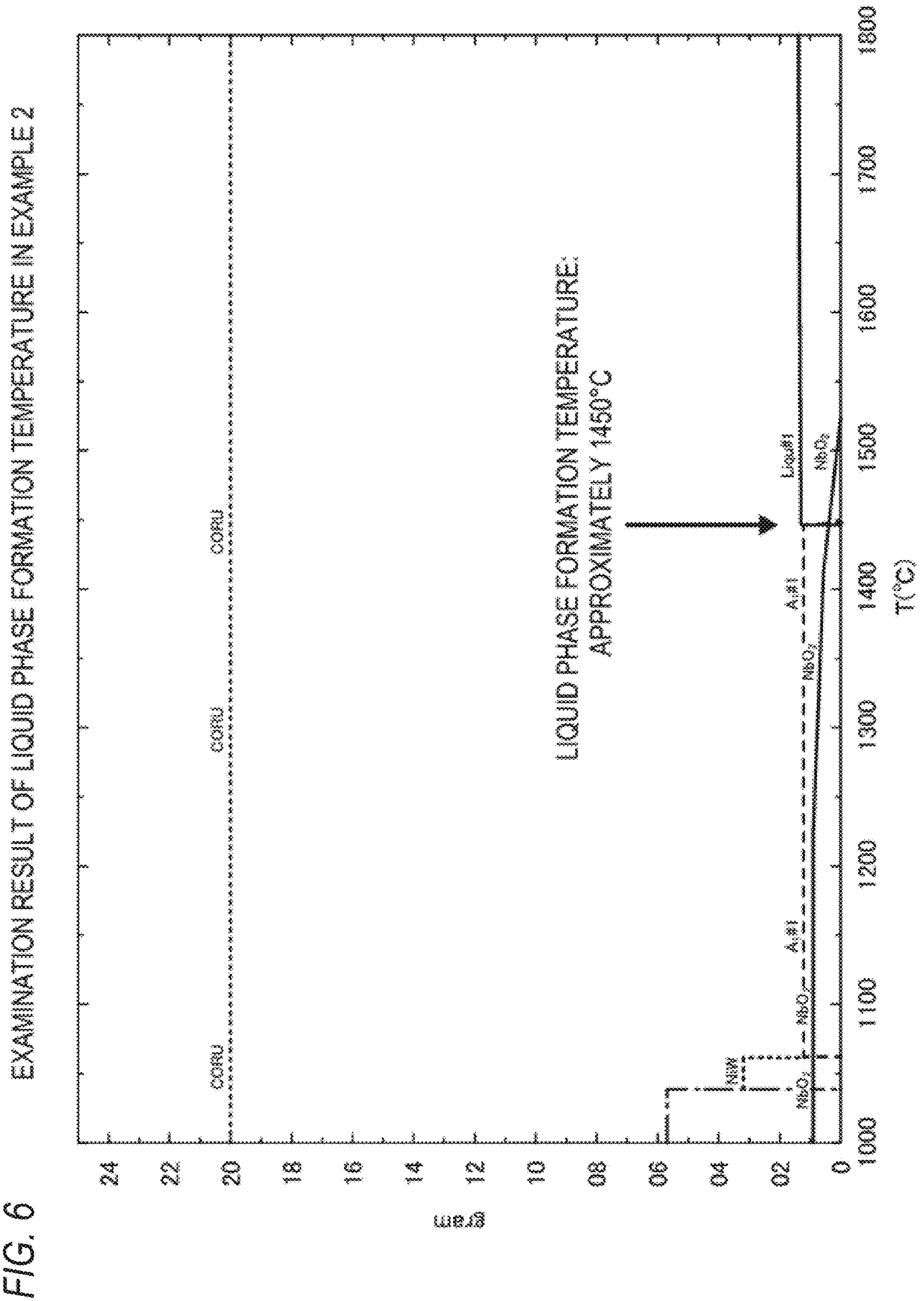
FIG. 6 is a graph showing examination results of a liquid phase formation temperature in Example 2.

Calculation results of Example 2 are shown in FIG. 6. As shown in FIG. 6, it was confirmed by calculation that a solid solution having a body-centered cubic lattice structure in which nickel and niobium were solid solved in tungsten was formed by sintering the materials according to Example 2. Further, in Example 2, the liquid phase formation temperature was about 1450° C.

Next, in Example 3, 1 g of nickel oxide and 1 g of indium oxide were added to 100 g of tungsten, and a liquid phase formation temperature when an adjustment was performed in an atmosphere of nitrogen and hydrogen was calculated by Fact Sage.

Figure 7:
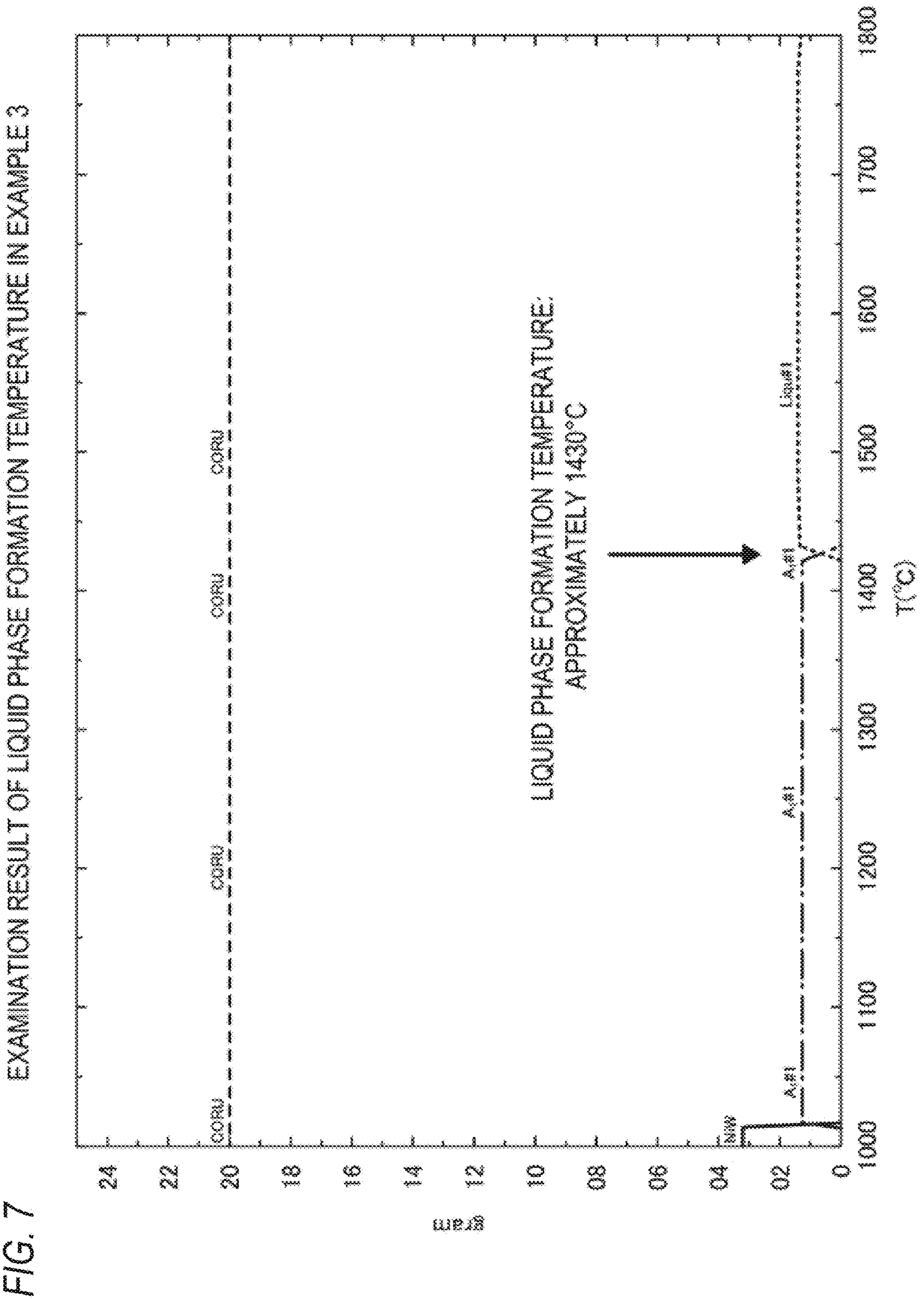
FIG. 7 is a graph showing examination results of a liquid phase formation temperature in Example 3.

Calculation results of Example 3 are shown in FIG. 7. As shown in FIG. 7, it was confirmed by calculation that a solid solution having a body-centered cubic lattice structure in which nickel and indium were solid solved in tungsten was formed by sintering the material according to Example 3. Further, in Example 3, the liquid phase formation temperature was about 1430° C.

As described above, when the nickel oxide and the manganese oxide, the nickel oxide and the niobium oxide, or the nickel oxide and the indium oxide are added to tungsten and fired, the liquid phase formation temperature can be about 1430° C. to 1450° C. Since this temperature is sufficiently lower than the melting point (3300° C. or higher) of tungsten and lower than the sintering temperature (for example, about 1500° C. to 1600° C.) of the base, tungsten can be easily sintered.

That is, the nickel oxide and the manganese oxide, the nickel oxide and the niobium oxide, and the nickel oxide and the indium oxide are useful as a sintering aid different from a sintering aid of the related art used in sintering a conductor pattern containing tungsten in a ceramic substrate.

Next, as Example 4, a predetermined element was further added to Examples 1 to 3, and the liquid phase formation temperature when an adjustment was performed in an atmosphere of nitrogen and hydrogen was calculated by Fact Sage.

For example, when 1 g of nickel oxide, 1 g of manganese oxide, and 1 g of boron oxide were added to 100 g of tungsten, and an adjustment was performed in an atmosphere of nitrogen and hydrogen, a liquid phase formation temperature was calculated by Fact Sage, and the liquid phase formation temperature was about 1410° C.

When 1 g of nickel oxide, 1 g of niobium oxide, and 1 g of iron oxide were added to 100 g of tungsten, and adjustment was performed in an atmosphere of nitrogen and hydrogen, the liquid phase formation temperature was calculated from Fact Sage, and the liquid phase formation temperature was about 1420° C.

When 1 g of nickel oxide, 1 g of indium oxide, and 1 g of gallium oxide were added to 100 g of tungsten, and an adjustment was performed in an atmosphere of nitrogen and hydrogen, the liquid phase formation temperature was calculated by Fact Sage, and the liquid phase formation temperature was about 1410° C.

When 1 g of nickel oxide, 1 g of niobium oxide, and 1 g of indium oxide were added to 100 g of tungsten, and adjustment was performed in an atmosphere of nitrogen and hydrogen, the liquid phase formation temperature was calculated by Fact Sage, and the liquid phase formation temperature was about 1390° C.

FIG. 8 summarizes the liquid phase formation temperatures calculated by the inventors by Fact Sage including the above results. FIG. 8 shows the liquid phase formation temperatures when the oxides of the elements shown in a vertical direction and a horizontal direction are added to tungsten together with nickel oxide. It can be seen from FIG. 8 that the liquid phase formation temperature can be about 1410° C. by adding nickel oxide, manganese oxide, and boron oxide to tungsten, for example.

As shown in a region surrounded by a coarse broken line in FIG. 8, the liquid phase formation temperature can be adjusted in a range of about 1410° C. to 1450° C. by adding nickel oxide, manganese oxide, and a predetermined element to tungsten. Then, by firing, it is possible to form a conductor pattern containing, as a main component, a solid solution having a body-centered cubic lattice structure in which nickel, manganese, and the predetermined element are solid solved in tungsten. The predetermined element in this case is boron, magnesium, scandium, vanadium, chromium, iron, zinc, gallium, germanium, strontium, zirconium, niobium, molybdenum, or barium.

Further, as shown in a region surrounded by a solid line in FIG. 8, the liquid phase formation temperature can be adjusted in a range of about 1390° C. to 1450° C. by adding nickel oxide, niobium oxide, and the predetermined element to tungsten. By firing, it is possible to form the conductor pattern containing, as the main component, the solid solution having the body-centered cubic lattice structure in which nickel, niobium, and the predetermined element are solid solved in tungsten. The predetermined element in this case is boron, magnesium, calcium, scandium, titanium, vanadium, chromium, manganese, iron, zinc, gallium, germanium, strontium, zirconium, molybdenum, indium, or barium.

Further, as shown in a region surrounded by a fine broken line in FIG. 8, the liquid phase formation temperature can be adjusted in a range of about 1390° C. to 1450° C. by adding nickel oxide, indium oxide, and the predetermined element to tungsten. Then, by firing, it is possible to form the conductor pattern containing, as the main component, the solid solution having the body-centered cubic lattice structure in which nickel, indium, and the predetermined element are solid solved in tungsten. The predetermined element in this case is magnesium, calcium, scandium, titanium, vanadium, chromium, zinc, gallium, germanium, strontium, zirconium, niobium, molybdenum, or barium.

In particular, when nickel oxide, niobium oxide, and indium oxide are added to tungsten, the liquid phase formation temperature can be set to about 1390° C., which is effective for lowering the liquid phase formation temperature.

Second Embodiment

Figure 9:
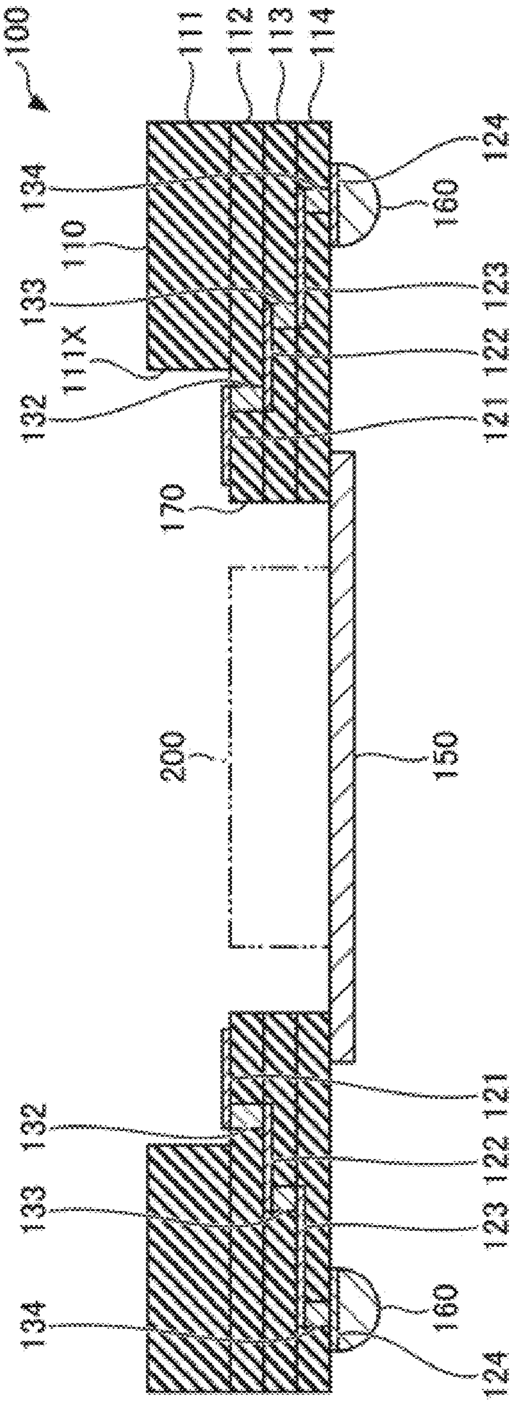
FIG. 9 is a cross-sectional view illustrating an example of a semiconductor device package according to a second embodiment.
Figure 10:
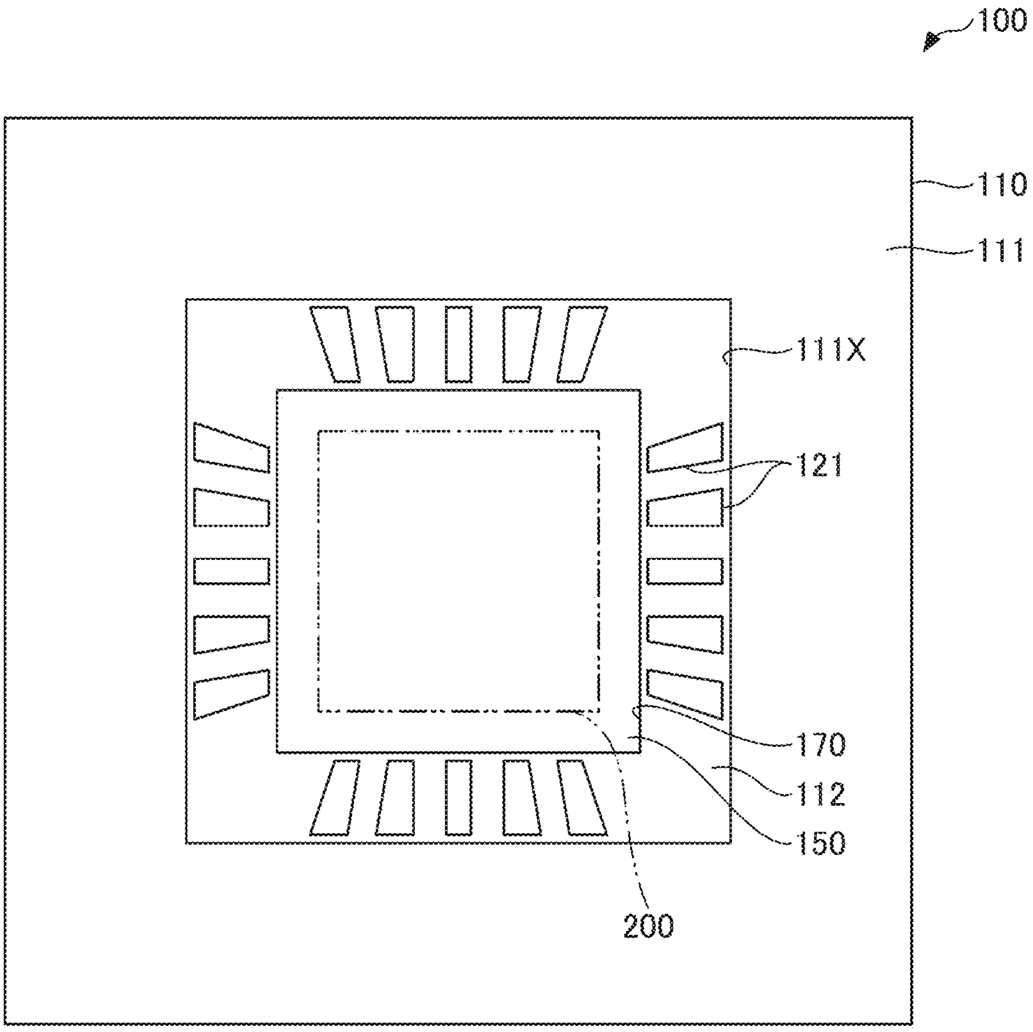
FIG. 10 is a plan view illustrating the example of the semiconductor device package according to the second embodiment.

In a second embodiment, an example of a semiconductor device package having the ceramic substrate described in the first embodiment will be described. FIG. 9 is a cross-sectional view illustrating the example of the semiconductor device package according to the second embodiment. FIG. 10 is a plan view illustrating the example of the semiconductor device package according to the second embodiment.

As shown in FIG. 9, the semiconductor device package 100 includes a ceramic substrate 110, a heat sink 150, and external connection terminals 160, and the heat sink 150 is attached to the ceramic substrate 110.

The ceramic substrate 110 includes a plurality of (four in the present embodiment) stacked ceramic base materials 111, 112, 113, and 114, wiring patterns 121, 122, 123, and 124 as an example of the conductor pattern, and vias 132, 133, and 134 penetrating the ceramic base materials 112, 113, and 114. The via 132 connects the wiring patterns 121 and 122 to each other, the via 133 connects the wiring patterns 122 and 123 to each other, and the via 134 connects the wiring patterns 123 and 124 to each other. In the ceramic substrate 110, the ceramic base materials 111 to 114 constitute a base.

As shown in FIGS. 8 and 9, the ceramic substrate 110 is provided with a cavity 170 which penetrates through central portions of the ceramic base materials 112, 113, and 114 and in which a semiconductor element 200 is mounted. The wiring pattern 121 is disposed on an upper surface of the ceramic base material 112 so as to surround the cavity 170. An opening 111X for exposing the wiring pattern 121 is formed in the ceramic base material 111.

The ceramic base materials 111 to 114 are ceramics made of aluminum oxide, and the wiring patterns 121 to 124 include, as a main component, a solid solution of a body-centered cubic lattice structure in which nickel and manganese are solid solved in tungsten, a solid solution of a body-centered cubic lattice structure in which nickel and niobium are solid solved in tungsten, and a solid solution of a body-centered cubic lattice structure in which nickel and indium are solid solved in tungsten. The wiring patterns 121 to 124 may further contain the predetermined element described above. The vias 132 to 134 are, for example, sintered bodies containing molybdenum as a main component, nickel oxide, aluminum oxide, and silicon dioxide. The ceramic substrate 110 can be manufactured by a method similar to the method of manufacturing the electrostatic chuck 20 of the first embodiment.

In the semiconductor device package 100, the semiconductor element 200 is mounted on the heat sink 150. The pad of the semiconductor element 200 is electrically connected to the wiring pattern 121 of the ceramic substrate 110 by a bonding wire or the like. Accordingly, the semiconductor element 200 is connected to the external connection terminals 160 through the wiring patterns 121 to 124 and the vias 132 to 134.

In the semiconductor device package 100, the wiring patterns 121 to 124 can be formed by sintering a conductive paste obtained by adding nickel oxide and manganese oxide to tungsten, a conductive paste obtained by adding nickel oxide and niobium oxide to tungsten, or a conductive paste obtained by adding nickel oxide and indium oxide to tungsten. The conductive paste may further contain the predetermined element described above. Accordingly, tungsten can be easily sintered as in the first embodiment.

Although the preferred embodiments and the like have been described in detail, the present invention is not limited to the embodiments and the like described above, and various modifications and substitutions can be made to the embodiments and the like described above without departing from the scope of the claims.

For example, in the first embodiment, the members and arrangement provided in the substrate fixing device may be appropriately changed.

In the first embodiment, the heating element 24 may be disposed between the electrostatic chuck 20 and the base plate 10. The heating element 24 may be provided inside the base plate 10. Further, the heating element 24 may be externally attached to a lower side of the electrostatic chuck 20.

The substrate fixing device according to the first embodiment is applied to the semiconductor manufacturing device, for example, a dry etching device (for example, a parallel plate type reactive ion etching (RIE) device).

Further, as the suction target object of the substrate fixing device according to the first embodiment, a glass substrate or the like used in a manufacturing process of a liquid crystal panel or the like may be exemplified in addition to the semiconductor wafer (silicon wafer or the like).

What is claimed is:

1. A ceramic substrate comprising:

a base; and a conductor pattern incorporated in the base, wherein the base is a ceramic, and the conductor pattern includes, as a main component, a solid solution of a body-centered cubic lattice structure in which nickel and manganese are solid solved in tungsten, a solid solution of a body-centered cubic lattice structure in which nickel and niobium are solid solved in tungsten, or a solid solution of a body-centered cubic lattice structure in which nickel and indium are solid solved in tungsten.

2. The ceramic substrate according to claim 1, wherein the conductor pattern contains, as a main component, a solid solution having a body-centered cubic lattice structure in which nickel, manganese, and a predetermined element are solid solved in tungsten, and the predetermined element is boron, magnesium, scandium, vanadium, chromium, iron, zinc, gallium, germanium, strontium, zirconium, niobium, molybdenum, or barium.

3. The ceramic substrate according to claim 1, wherein the conductor pattern contains, as a main component, a solid solution having a body-centered cubic lattice structure in which nickel, niobium, and a predetermined element are solid solved in tungsten, and the predetermined element is boron, magnesium, calcium, scandium, titanium, vanadium, chromium, manganese, iron, zinc, gallium, germanium, strontium, zirconium, molybdenum, indium, or barium.

4. The ceramic substrate according to claim 1, wherein the conductor pattern contains, as a main component, a solid solution having a body-centered cubic lattice structure in which nickel, indium, and a predetermined element are solid solved in tungsten, and the predetermined element is magnesium, calcium, scandium, titanium, vanadium, chromium, zinc, gallium, germanium, strontium, zirconium, niobium, molybdenum, or barium.

5. The ceramic substrate according to claim 1, wherein the base is an aluminum oxide ceramic containing an yttrium aluminum garnet phase.

6. The ceramic substrate according to claim 1, wherein the base is an aluminum oxide ceramic having a purity of aluminum oxide of 99 wt % or more.

7. A semiconductor device package comprising:

the ceramic substrate according to claim 1.

8. An electrostatic chuck, wherein in the ceramic substrate according to claim 1, the conductor pattern is an electrostatic electrode.

9. A substrate fixing device comprising:

a base plate; and the electrostatic chuck according to claim 8 mounted on one surface of the base plate.

* * * * *